US009960023B2

(12) United States Patent
Wei et al.

(10) Patent No.: US 9,960,023 B2
(45) Date of Patent: May 1, 2018

(54) METHODS AND APPARATUS FOR NODULE CONTROL IN A TITANIUM-TUNGSTEN TARGET

(71) Applicant: APPLIED MATERIALS, INC., Santa Clara, CA (US)

(72) Inventors: Junqi Wei, Xi'an (CN); Zhitao Cao, Campbell, CA (US); Yueh Sheng Ow, Singapore (SG); Ananthkrishna Jupudi, Milipitas, CA (US); Kirankumar Savandaiah, Bangalore (IN); Xin Wang, Singapore (SG); Sriskantharajah Thirunavukarasu, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 405 days.

(21) Appl. No.: 14/587,967

(22) Filed: Dec. 31, 2014

(65) Prior Publication Data

US 2016/0189941 A1 Jun. 30, 2016

(51) Int. Cl.

| C23C 14/34 | (2006.01) |
|---|---|
| H01J 37/34 | (2006.01) |
| C22C 1/04 | (2006.01) |
| C22C 27/04 | (2006.01) |
| B22F 3/12 | (2006.01) |
| C22C 14/00 | (2006.01) |

(52) U.S. Cl.
CPC ........ *H01J 37/3429* (2013.01); *C22C 1/0458* (2013.01); *C22C 27/04* (2013.01); *C23C 14/3414* (2013.01); *H01J 37/3426* (2013.01); *H01J 37/3491* (2013.01); *B22F 3/12* (2013.01); *B22F 2998/10* (2013.01); *B22F 2999/00* (2013.01); *C22C 14/00* (2013.01)

(58) Field of Classification Search
CPC .............. C23C 14/3414; H01J 37/3429; H01J 37/3426; H01J 37/3491; C22C 1/0458; C22C 27/04
See application file for complete search history.

(56) References Cited

U.S. PATENT DOCUMENTS

| 5,234,487 | A | 8/1993 | Wickersham, Jr. et al. |
|---|---|---|---|
| 5,298,338 | A | 3/1994 | Hiraki |
| 5,306,569 | A | 4/1994 | Hiraki |
| 5,896,553 | A | 4/1999 | Lo |
| 6,086,735 | A | 7/2000 | Gilman et al. |
| 6,524,956 | B1 | 2/2003 | Tian et al. |
| 2009/0075067 | A1 | 3/2009 | Myli et al. |

(Continued)

OTHER PUBLICATIONS

International Search Report and Written Opinion dated Jan. 29, 2016 for PCT Application No. PCT/US2015/056930.

*Primary Examiner* — John J Brayton
(74) *Attorney, Agent, or Firm* — Moser Taboada; Alan Taboada

(57) ABSTRACT

Embodiments of the present disclosure include methods and apparatus for controlling titanium-tungsten (TiW) target nodule formation. In some embodiments, a target includes: a source material comprising predominantly titanium (Ti) and tungsten (W), formed from a mixture of titanium powder and tungsten powder, wherein a grain size of a predominant quantity of the titanium powder is less than or equal to a grain size of a predominant quantity of the tungsten powder.

16 Claims, 2 Drawing Sheets

(56) References Cited

U.S. PATENT DOCUMENTS

| | | |
|---|---|---|
| 2009/0078570 A1 | 3/2009 | Yi et al. |
| 2012/0228773 A1 | 9/2012 | Brown et al. |
| 2014/0120723 A1 | 5/2014 | Fu et al. |
| 2015/0162172 A1* | 6/2015 | Lo .................. H01J 37/3426 |
| | | 204/298.13 |

* cited by examiner

METHODS AND APPARATUS FOR NODULE CONTROL IN A TITANIUM-TUNGSTEN TARGET

FIELD

Embodiments of the present disclosure generally relate to substrate processing systems.

BACKGROUND

Tungsten and titanium films are frequently used in the manufacture of semiconductor devices, for example as diffusion barriers between silicon substrates and aluminum alloy metallizations. The titanium-tungsten (TiW) films are formed by sputtering titanium-tungsten targets.

During the sputtering process, titanium-tungsten material is sputtered from the surface of the target and deposited onto a substrate disposed opposite the surface of the target. However, the inventors have observed that nodules may form on the sputtering face of the target as material from the central portion of the target is sputtered and redeposited on the outer peripheral edge of the target face rather than on the substrate. Furthermore, the nodules have a tendency to flake and generate particles that can contaminate and adversely affect the quality of the deposited titanium-tungsten film on the substrate.

Accordingly, the inventors have provided improved methods and apparatus for controlling titanium-tungsten (TiW) target nodule formation.

SUMMARY

Embodiments of the present disclosure include methods and apparatus for controlling titanium-tungsten (TiW) target nodule formation. In some embodiments, a target includes: a source material comprising predominantly titanium (Ti) and tungsten (W), formed from a mixture of titanium powder and tungsten powder, wherein a grain size of a predominant quantity of the titanium powder is less than or equal to a grain size of a predominant quantity of the tungsten powder.

In some embodiments, a method of forming a titanium-tungsten (Ti—W) target includes: mixing a tungsten powder and a titanium powder to form a mixture, wherein a grain size of a predominant quantity of the titanium powder in the mixture is less than or equal to a grain size of a predominant quantity of the tungsten powder; compacting the mixture; and heating the mixture to form the target.

In some embodiments, a method of removing nodules from a target includes: (a) exposing the target to an inert gas, wherein the target comprises a source material, comprising predominantly titanium (Ti) and tungsten (W), formed from a mixture of titanium powder and tungsten powder, and wherein a grain size of a predominant quantity of the titanium powder is less than or equal to a grain size of a predominant quantity of the tungsten powder; (b) applying DC power to the target at a first power to ignite the inert gas to form a plasma; and (c) increasing the DC power to the target to a second power to remove nodules from the target.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
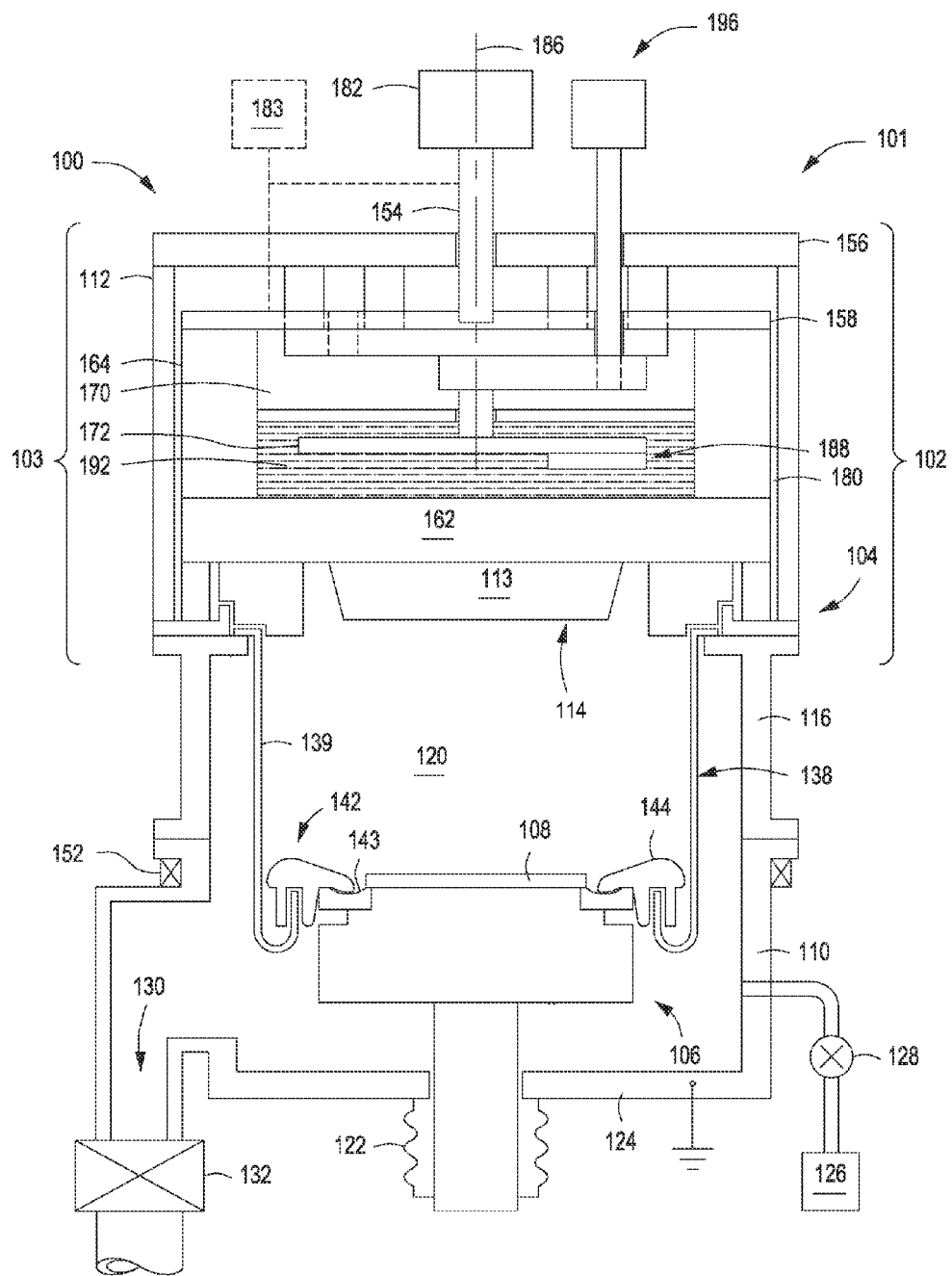
FIG. 1 depicts a schematic cross sectional view of a process chamber having a target assembly in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure include methods and apparatus for controlling titanium-tungsten (TiW) target nodule formation. In embodiments of the current disclosure, the formation of nodules on a titanium-tungsten (TiW) target can advantageously be reduced, eliminated, or substantially eliminated, by target raw material grain size control, as well as by an optional periodic cleaning process. In embodiments of the current disclosure, target grain size control advantageously prevents or delays nodule formation, while the cleaning process advantageously removes any nodules generated on the surface of the target.

FIG. 1 depicts a simplified, cross-sectional view of a physical vapor deposition (PVD) chamber 100. The PVD chamber 100 comprises a substrate support 106 in accordance with some embodiments of the present disclosure. Examples of PVD chambers suitable for modification in accordance with the teachings provided herein include chambers having very high frequency (VHF) sources, the ALPS® Plus and SIP ENCORE® PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein and be used to perform embodiments of the inventive methods disclosed herein.

In some embodiments, the PVD chamber 100 includes a chamber lid 101 disposed atop a chamber body 104 and removable from the chamber body 104. The chamber lid 101 may include a target assembly 102 and a grounding assembly 103.

The target assembly 102 comprises a target 114. The target 114 may comprise a source material 113 and a backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

The source material 113 is deposited on a substrate, such as the substrate 108 during sputtering (for example, a semiconductor or other material wafer). In some embodiments, the source material 113 comprises predominantly titanium (Ti) and tungsten (W). In some embodiments, the source material 113 consists of, or consists essentially of titanium (Ti) and tungsten (W). In some embodiments, the target 114 comprises about 90 weight percent tungsten (W) and about 10 weight percent titanium (Ti). In some embodiments, the target 113 has a density (i.e. target weight/target volume) of at least about 98 percent. In some embodiments, the target 114 has a purity of at least 5N (i.e., 99.999% purity).

In general, titanium-tungsten targets are fabricated by mixing tungsten raw material powder and titanium raw material powder. The resulting mixture is compacted and heated using a suitable forming method, such as inert gas hot pressing, vacuum hot pressing, hot isostatic pressing, cold pressing/sintering, or the like. The inventors have observed that nodules tend to form once the surface of the target 114 forms titanium-rich or tungsten-rich regions. The inventors have further observed that adjusting the average grain size of the tungsten raw material powders and titanium raw material powders can reduce titanium-rich or tungsten-rich regions and thus advantageously reduce or eliminate nodule formation.

In some embodiments, a grain size of a predominant quantity of the titanium powder is less than or equal to a grain size of a predominant quantity of the tungsten powder. In some embodiments, an average grain size of the titanium powder is less than or equal to an average grain size of the tungsten powder. In some embodiments, the grain size of substantially all of the titanium powder is less than or equal to the grain size of substantially all of the tungsten powder. For example, in some embodiments, the average grain size of the titanium grains is less than about 30 µm, or in some embodiments less than about 20 µm. In some embodiments, the average grain size of the tungsten grains is about 20 µm to about 45 µm. In some embodiments, the average grain size of the titanium powder and the average grain size of the tungsten powder are each about 20 µm to about 30 µm. In some embodiments, after forming the target, the target may have an average titanium-tungsten grain size of about 60 µm.

The inventors have discovered that forming a target using titanium powder and tungsten powder having the grain sizes discussed above advantageously reduces or eliminates the formation of nodules on the target 114. Moreover, the inventors have further observed that a lifetime of a target formed as described herein unexpectedly and advantageously increased by a factor of about 5 (for example, from about 70 kilowatt-hours to about 350 kilowatt-hours).

Figure 2:
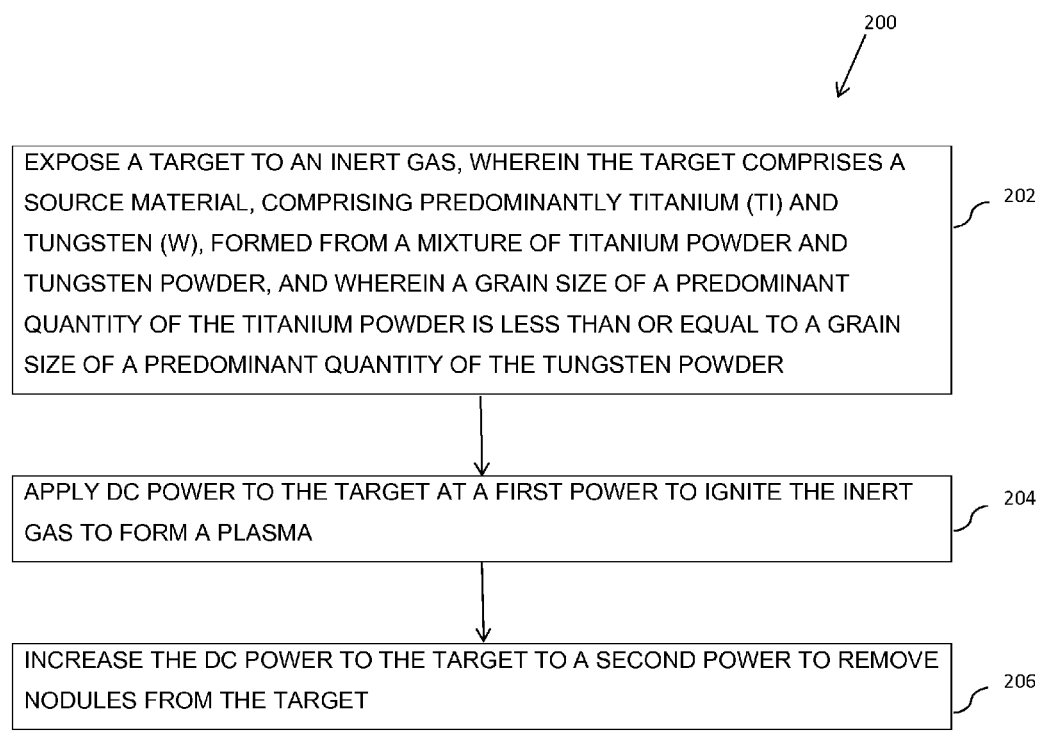
FIG. 2 depicts a method of controlling titanium-tungsten (TiW) target nodules in accordance with some embodiments of the present disclosure.

In some embodiments, an optional periodic cleaning process is performed to remove nodules generated on the surface of the source material 113. FIG. 2 depicts a method 200 of removing nodules formed on the surface of the source material 113 in accordance with some embodiments of the present disclosure.

The method generally begins at 202, where the target 114 is exposed to an inert gas, such as argon, helium, or the like. In some embodiments, the inert gas is provided at a suitable flow rate, for example about 200 sccm.

At 204, DC power is applied to the target 114 at a first power sufficient to ignite the inert gas and form a plasma in the first volume 120. In some embodiments, the first power is about 500 watts. In some embodiments, the target 114 is exposed to the plasma formed from the inert gas for about 2 seconds.

At 206, the DC power to the target is increased to a second power to remove nodules from the target 114. In some embodiments, the second power is about 1000 watts. In some embodiments, the target 114 is exposed to the plasma formed from the inert gas at the second power for about 600 seconds.

The method 200 can be performed after one or more of processing a predetermined number of substrates 108, after a predetermined number of target life hours, after observing an increase in particles, or the like. For example, in some embodiments, the method 200 may be performed after processing every 12 substrates, or after every 100 kilowatt-hours of target life, or a combination thereof. In some embodiments, 202-206 may be repeated for a period of time suitable to remove all or substantially all nodules from the target 114. The inventors have further observed that the target life of a target formed from a mixture of titanium powder and tungsten powder as described herein, and subjected to the method 200, can advantageously and unexpectedly be increased by a factor of about 7 (for example, from about 70 kilowatt-hours to about 500 kilowatt-hours).

Returning to FIG. 1, the chamber body 104 contains a substrate support 106 for receiving a substrate 108 thereon. The substrate support 106 may be located within a lower grounded enclosure wall 110, which may be a chamber wall of the chamber body 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as RF return paths that travel from the substrate support 106 via a process kit shield (e.g. a shield 138 as discussed below) and ultimately back to the grounding assembly 103 of the chamber lid 101. The RF power source 182 may provide RF power to the target assembly 102 as discussed below.

The substrate support 106 has a material-receiving surface facing a principal surface of a target 114 (or source material) and supports the substrate 108 to be sputter coated with material from the target 114 in planar position opposite to the principal surface of the target 114. In some embodiments, the substrate 108 may be held on the substrate support 106 by a vacuum or by electrostatic attraction. In some embodiments, the substrate support 106 may include an electrode (not shown) which may be used to provide electrostatic chucking power or RF bias power to the substrate support 106.

The substrate support 106 may support the substrate 108 in a first volume 120 of the chamber body 104. The first volume 120 may be a portion of the inner volume of the chamber body 104 that is used for processing the substrate 108 and may be separated from the remainder of the inner volume (e.g., a non-processing volume) during processing of the substrate 108. The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through a load lock valve, or opening, (not shown) in the lower portion of the chamber body 104 and thereafter raised or lowered for a particular application. A bellows 122 connected to a bottom chamber wall 124 may be provided to maintain a separation of the inner volume of the chamber body 104 from the atmosphere outside of the chamber body 104. One or more gases may be supplied from a gas source 126 through a mass flow controller 128 into the lower part of the chamber body 104. An exhaust port 130 may be provided and coupled to a pump (not shown) via a valve 132 for exhausting the interior of the chamber body 104 and to facilitate maintaining a predetermined pressure inside the chamber body 104.

The chamber body 104 further comprises a process kit 142. The process kit may include a first ring 143 (i.e. a deposition ring) and a second ring 144 (i.e. a cover ring). In some embodiments, the first ring 143 is an annular ring around the substrate support 106 to shield the sidewall and peripheral edge of the substrate support 106 from process deposits. In some embodiments, the second ring 144 is an annular ring disposed above the first ring 143 and is generally used to prevent deposition below the substrate and to assist in controlling deposition at or below the substrate's edge. In some embodiments, the first ring 143 and second ring 144 may have other suitable configurations, depending upon the geometry of the substrate and substrate support.

The chamber body 104 further includes a process kit shield, or shield 138, to surround the processing, or first volume of the chamber body 104 and to protect other chamber components from damage and/or contamination from processing. In some embodiments, the shield 138 may be a grounded shield connected to a ledge 140 of an upper grounded enclosure wall 116 of the chamber body 104.

The shield 138 extends downwardly and may include one or more sidewalls 139 configured to surround the first volume 120. The second ring 144 rests on the top of a bottom u-shaped portion of the shield 138. In some embodiments, as depicted in FIG. 1, sidewalls 139 of the shield 138 are substantially vertical to provide a flat area having a large radius to prevent peeling of sputtered target material that may adhere to the sidewalls 139 of the shield.

In some embodiments, a magnet 152 may be disposed about the chamber body 104 for selectively providing a magnetic field between the substrate support 106 and the target 114. For example, as shown in FIG. 1, the magnet 152 may be disposed about the outside of the lower grounded enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 that may be generally parallel to and opposite a backside of the target assembly 102. A grounding shield 112 may extending from the grounding plate 156 and surround the target assembly 102.

The target assembly 102 may include a source distribution plate 158 opposing a backside of the target 114 and electrically coupled to the target 114 along a peripheral edge of the target 114. A conductive member 164 may be disposed between the source distribution plate 158 and the backside of the target 114 to propagate RF energy from the source distribution plate 158 to the peripheral edge of the target 114.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like.

In some embodiments, the target assembly 102 may have the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member. In embodiments where the second energy source 183 is a second RF power source, the second energy source may be coupled to the target assembly 102 via the electrode 154.

The target assembly 102 may include a cavity 170 disposed between the backside of the target 114 and the source distribution plate 158. The cavity 170 may at least partially house a magnetron assembly 196. In some embodiments, the cavity 170 may be at least partially filled with a cooling fluid 192, such as water ($H_2O$) or the like. One or more portions of the magnetron assembly 196 may be disposed at least partially within the cavity 170. The magnetron assembly provides a rotating magnetic field proximate the target to assist in plasma processing within the chamber body 104. In some embodiments, the magnetron assembly 196 includes a plurality of magnets 188 coupled to a magnet support member 172 that can be rotated within the cavity 170.

While the foregoing is directed to embodiments of the present disclosure, other and further embodiments of the disclosure may be devised without departing from the basic scope thereof.

The invention claimed is:

1. A target, comprising:
a source material comprising predominantly titanium (Ti) and tungsten (W), formed from a mixture of titanium powder and tungsten powder, wherein a grain size of a predominant quantity of the titanium powder is less than a grain size of a predominant quantity of the tungsten powder.

2. The target of claim 1, wherein target comprises a source material consisting essentially of titanium (Ti) and tungsten (W).

3. The target of claim 1, wherein the grain size of substantially all of the titanium powder is less than or equal to the grain size of substantially all of the tungsten powder.

4. The target of claim 1, wherein the target comprises about 90 weight percent tungsten (W) and about 10 weight percent titanium (Ti).

5. The target of claim 1, wherein the target further comprises a density of at least about 98 percent.

6. The target of claim 1, wherein an average grain size of the titanium powder is less than about 20 μm.

7. The target of claim 6, wherein an average grain size of the tungsten powder is about 20 μm to about 45 μm.

8. The target of claim 1, wherein an average grain size of the titanium powder and an average grain size of the tungsten powder are each about 20 μm to about 30 μm.

9. The target of claim 1, wherein after forming the target, the target has an average titanium-tungsten grain size of about 60 μm.

10. A target, comprising:
a source material comprising predominantly titanium (Ti) and tungsten (W), formed from a mixture of titanium powder and tungsten powder, wherein a grain size of a predominant quantity of the titanium powder is less than or equal to a grain size of a predominant quantity of the tungsten powder, wherein an average grain size of the tungsten powder is about 20 μm to about 45 μm, and wherein after forming the target, the target has an average titanium-tungsten grain size of about 60 μm.

11. The target of claim 10, wherein an average grain size of the titanium powder is less than about 20 μm.

12. The target of claim 10, wherein an average grain size of the titanium powder and an average grain size of the tungsten powder are each about 20 μm to about 30 μm.

13. The target of claim 10, wherein target comprises a source material consisting essentially of titanium (Ti) and tungsten (W).

14. The target of claim 10, wherein the grain size of substantially all of the titanium powder is less than or equal to the grain size of substantially all of the tungsten powder.

15. The target of claim 10, wherein the target comprises about 90 weight percent tungsten (W) and about 10 weight percent titanium (Ti).

16. The target of claim 10, wherein the target further has a density of at least about 98 percent.

* * * * *